United States Patent [19]
Horwath

[11] 3,787,738
[45] Jan. 22, 1974

[54] PULSE PRODUCING CIRCUIT

[75] Inventor: Tibor G. Horwath, San Diego, Calif.

[73] Assignee: The United States of America as represented by the Secretary of the Army, Washington, D.C.

[22] Filed: Sept. 28, 1972

[21] Appl. No.: 293,190

[52] U.S. Cl. .................. 307/237, 307/253, 307/297
[51] Int. Cl. .......................................... H03k 17/00
[58] Field of Search ... 307/268, 283, 302, 296, 297, 307/237, 253, 254

[56] References Cited

UNITED STATES PATENTS

| | | | |
|---|---|---|---|
| 3,371,252 | 2/1968 | James | 307/283 X |
| 3,643,115 | 2/1972 | Kiffmeyer | 307/296 |
| 3,302,033 | 1/1967 | Goodrich | 307/268 |
| 3,448,300 | 6/1969 | Gyugi | 307/268 X |
| 3,686,516 | 8/1972 | Guadagnola | 307/268 X |
| 3,646,578 | 2/1972 | Gregory | 307/268 |
| 3,391,351 | 7/1968 | Trent | 307/302 |
| 3,223,854 | 12/1965 | Hansen et al. | 307/283 |

*Primary Examiner*—John S. Heyman
*Assistant Examiner*—B. P. Davis
*Attorney, Agent, or Firm*—Harry M. Saragovitz et al.

[57] ABSTRACT

A circuit for producing pulses having a very high, steeply rising front portion of short duration, followed by a considerably longer portion of lower current is disclosed. The circuit utilizes a single transistor which is operated in the avalanche breakdown mode to provide the high, steeply rising, front portion of the output pulse and is then operated in the normal amplifier mode to provide the longer lower current rear portion of the output pulse. While the circuit has general utility as a pulse producing circuit, it is particularly useful as a thyristor firing circuit.

1 Claim, 2 Drawing Figures

PULSE PRODUCING CIRCUIT

The invention described herein may be manufactured, used, and licensed by or for the Government for Governmental purposes without the payment to me of any royalties thereon.

BACKGROUND OF THE INVENTION

This invention relates to pulse producing circuitry, and more particularly, to a circuit for producing an output pulse having a very high, steeply rising front portion of short duration followed by a considerably longer portion of lower current.

There are many electrical circuits that require input pulses having a special shape or characteristic and many different types of circuits have been devised for providing these special pulses. For example, certain operating conditions of thyristors require a specially shaped gate current pulse. The gate current pulse must have a very high, steeply rising front portion of short duration followed by a considerably longer portion of low current. Circuits for generating such pulses are known in the art. However, these prior art circuits are generally sophisticated expensive transistor circuits.

This invention provides a simple one-transistor circuit capable of generating thyristor gate current pulses having the above described shape. The circuit of this invention is capable of generating pulses having rise times between one and five nenoseconds and peak currents up to ten amperes measured on the load equivalent to the gate impedance of an average thyristor. Thus, the circuitry of this invention is particularly adapted for use as a thyristor firing circuit. However, the circuitry of the invention does have general utility as a pulse generating circuit capable of producing a pulse having a particular shape.

SUMMARY OF THE INVENTION

The circuit of this invention is a simple one-transistor circuit capable of producing, in response to a generally rectangular input pulse applied to the base of the transistor, an output pulse having a very high, steeply rising front portion of short duration, followed by a considerably longer portion of lower current. A pair of separate voltage sources are coupled between the emitter and collector of the transistor. The first of this pair of voltage sources has its negative side directly connected to the emitter of the transistor and its positive side coupled to the collector of the transistor through a resistor and the primary winding of a transformer. The second of the pair of voltage sources also has its negative side directly connected to the emitter of the transistor and its positive side coupled to the collector of the transistor through a pair of oppositely poled series connected diodes. A capacitor is connected between the positive side of the first of said pair of voltage sources and the common point of the series connected diodes. The common point of the resistor and primary winding of the transformer is also connected to the common point of the series connected diodes. The load which may be the gate circuit of a thyristor is connected across the secondary winding of the transformer.

The leading edge of the input pulse, which is applied to the base of the transistor, will initiate avalanche break down in the transistor, thereby driving a high current bias through the load. After the output pulse peaks, the current will decay due to the charging of the capacitor that is connected between the positive side of the first voltage source and the common point of the series connected diodes. This decaying process will continue until the voltage on the capacitor approaches a value that is equal to the difference between the pair of voltage sources. At this point the collector-emitter voltage will be clamped at a value equal to the value of the second voltage source which is within the normal operating region of the transistor. The transistor then starts to operate as a conventional pulse amplifier to supply the rear portion of the output pulse.

It is therefore an object of this invention to provide a pulse generating circuit.

It is another object of this invention to provide a circuit capable of generating a special shaped output pulse.

It is still another object of this invention to provide a pulse generating circuit capable of producing an output pulse having a very high, steeply rising front portion, followed by a considerably longer portion of lower current.

It is still a further object of this invention to provide a high power, fast rise thyristor firing circuit.

DESCRIPTION OF THE DRAWING

The above-mentioned and other objects of the invention will become readily apparent from the following detailed description when read in conjunction with the annexed drawing in which.

DESCRIPTION OF THE INVENTION

Figure 1:
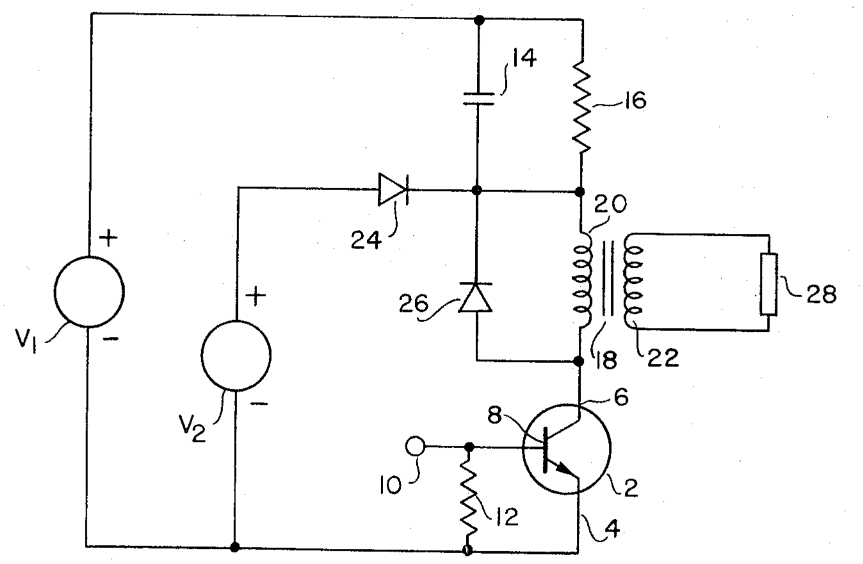
FIG. 1 is a schematic diagram showing a preferred embodiment of the invention.

Referring to the drawing, FIG. 1 is a schematic diagram showing a preferred embodiment of the pulse generating circuitry of this invention. As shown in FIG. 1, the circuit utilizes a single transistor 2 having an emitter 4, a collector 6, and a base 8. The base 8 is directly connected to the input terminal 10. A resistor 12 is connected between base 8 and emitter 4. A first voltage source V1 has its negative side directly connected to emitter 4. The positive side of voltage source V1 is coupled to collector 6 of transistor 2 through the series combination of a resistor 16 and the primary winding 20 of the transformer 18. A capacitor 14 is connected across resistor 16. A second voltage source V2 also has its negative side directly connected to emitter 4 of transistor 2. The positive side of voltage source V2 is coupled to the collector 6 of transistor 2 through the oppositely poled series connected diodes 24 and 26. Capacitor 14 in addition to being shunted across resistor 16 is connected in series with diode 26 between the positive side of voltage source V1 and collector 6 of transistor 2. A load 28 is connected across the secondary winding 22 of transformer 18. Since the circuit of FIG. 1 has a particular utility as a thyristor firing circuit, load 28 may be the gate circuit of a thyristor.

Figure 2:
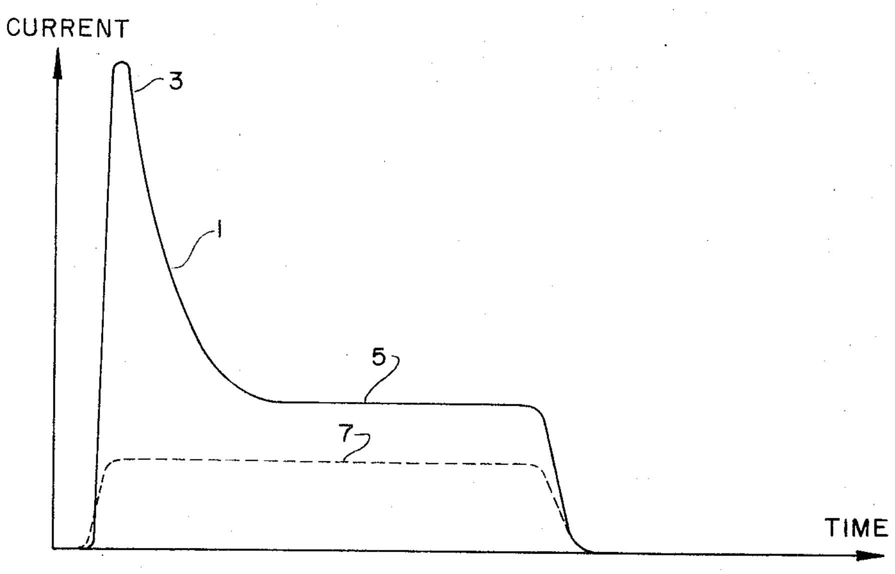
FIG. 2 shows the output pulse produced by the circuit of FIG. 1 and the input pulse utilized to provide this output pulse.

As has been previously mentioned, certain operating conditions of thyristors require gate current pulses having a very high, steeply rising front portion of short duration, followed by a considerably longer portion of lower current. Such a current pulse, which is produced by the circuitry of FIG. 1, is shown in FIG. 2. As shown in FIG. 2, the pulse 1 has a very high, steeply rising front portion of short duration 3, followed by a considerably longer portion 5 of lower current. This pulse 1 is produced in response to the generally rectangular pulse 7 illustrated by the dashed line in FIG. 2. This input pulse 7 is applied to the base 8 of transistor 2.

Initially, the collector-emitter voltage of transistor 2 is $V_1$. The leading edge of pulse 7 when applied to base 8 of transistor 2 will initiate avalanche break down in transistor 2, thereby driving a high current pulse through the load 28. This high current pulse is the portion 3 of pulse 1 in FIG. 2. As illustrated in FIG. 2, the current pulse 1 after reaching its peak will begin to decay. This decay is due to the charging of capacitor 14 over the transformed load resistance which is much smaller than the resistance of resistor 16. This decaying process will continue until the voltage on capacitor 14 approaches the value of V1 minus V2. At this point, diode 26 starts to conduct and clamps the collector-emitter voltage of transistor 2 at the value of voltage source V2. The value of voltage V2 is within the normal operating region of transistor 2; therefore, transistor 2 starts to operate as a conventional pulse amplifier. When transistor 2 is operating as a conventional pulse amplifier, the output provided to load 28 is the portion 5 of pulse 1. The portion 5 of pulse 1 continues until input pulse 7 terminates.

From the foregoing description it is quite obvious that the simple one-transistor circuit of this invention is capable of producing a current output pulse of the character described and shown in FIG. 2. Thus, this circuit is ideally suited for use as a thyristor firing circuit. However, the circuit is not limited to this use but has general utility. That is, the circuit can be used wherever a pulse having a very high, steeply rising front portion of short duration, followed by a considerably longer portion of lower current is desired or required. The circuit of this invention is able to generate such pulses having rise times between one and five nenoseconds and peak currents of up to ten amperes when measured on a load equivalent to the gate impedence of an average thyristor. Prior art circuits capable of producing such pulses are far more complex than the simple single transistor circuit of this invention.

While the invention has been described with reference to a specific embodiment, it will be apparent to those skilled in the art that various changes and modifications can be made to the embodiment shown and described without departing from the spirit and scope of the invention as set forth in the appended claims.

What is claimed is:

1. A pulse generating circuit comprising:

a transistor having a base electrode, an emitter electrode, and a collector electrode;

a first voltage source coupled between said collector and said emitter, wherein said first voltage source has its negative side directly connected to said emitter and its positive side coupled to said collector through the series combination of a first resistor and the primary winding of a simple transformer;

a second voltage source coupled between said collector and said emitter, wherein said second voltage source has its negative side directly connected to said emitter and its positive side coupled to said collector through a pair of series connected oppositely poled diodes;

a capacitor connected between the positive side of said first voltage source and the common point of said series connected diodes;

means directly connecting said common point of said series connected diodes and the common point of said series combination of said first resistor and said primary winding of said simple transformer;

a thyristor input gate circuit connected across the secondary winding of said simple transformer;

a second resistor connected between said base electrode and said emitter electrode;

and input pulse means adapted to apply an input pulse across said base and emitter electrodes of said transistor, said pulse means having an output pulse configuration such that said transistor operates in the avalanche break down mode during the initial portion of said input pulse and operates in a conventional amplifier mode during the balance of said input pulse.

* * * * *